United States Patent
Nakamura

(10) Patent No.: US 7,239,008 B2
(45) Date of Patent: Jul. 3, 2007

(54) SEMICONDUCTOR APPARATUS AND METHOD FOR FABRICATING THE SAME

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 974 days.

(21) Appl. No.: 10/212,171

(22) Filed: Aug. 6, 2002

(65) Prior Publication Data

US 2003/0038361 A1     Feb. 27, 2003

(30) Foreign Application Priority Data

Aug. 23, 2001   (JP)   ............... 2001-253513

(51) Int. Cl.
   *H01L 23/495*    (2006.01)
(52) U.S. Cl. ............... 257/666; 257/669; 257/674; 257/690; 257/692; 257/693; 257/694; 257/695; 257/696; 257/E23.031; 257/E23.045; 257/E23.046; 257/E23.047; 257/E23.048
(58) Field of Classification Search ............ None
   See application file for complete search history.

(56) References Cited

U.S. PATENT DOCUMENTS

| | | | |
|---|---|---|---|
| 4,989,117 A * | 1/1991 | Hernandez | ............ 361/306.2 |
| 5,367,124 A * | 11/1994 | Hoffman et al. | ............ 174/552 |
| 5,455,446 A * | 10/1995 | Suppelsa et al. | ............ 257/467 |
| 5,616,953 A * | 4/1997 | King et al. | ............ 257/666 |
| 6,150,712 A * | 11/2000 | Himeno et al. | ............ 257/677 |
| 6,437,429 B1* | 8/2002 | Su et al. | ............ 257/666 |
| 7,057,273 B2* | 6/2006 | Harnden et al. | ............ 257/696 |

FOREIGN PATENT DOCUMENTS

| | | |
|---|---|---|
| JP | 1-113359 | 7/1989 |
| JP | 04-256351 | 9/1992 |
| JP | 05-291460 | 11/1993 |
| JP | 2000-252389 | 9/2000 |

* cited by examiner

*Primary Examiner*—Jasmine Clark
(74) *Attorney, Agent, or Firm*—Volentine & Whitt, P.L.L.C.

(57) ABSTRACT

A semiconductor apparatus includes a semiconductor pellet having electrodes thereon; a plurality of lead terminals, which electrically connect the electrodes of the semiconductor pellet to terminals formed on a substrate; and a molding member, which is filled around the semiconductor pellet and upper parts of the lead terminals. The plurality of lead terminals are shaped to be elongated strips and are arranged to extend out of the molding member toward the substrate.

16 Claims, 17 Drawing Sheets

SEMICONDUCTOR APPARATUS AND METHOD FOR FABRICATING THE SAME

CROSS REFERENCE TO RELATED APPLICATION

This application claims the priority of Application No. 2001-253513, filed Aug. 23, 2001 in Japan, the subject matter of which is incorporated herein by reference.

TECHNICAL FIELD OF THE INVENTION

This invention relates to a semiconductor apparatus and a method for fabricating the same. More particularly, the present invention relates to a semiconductor apparatus having lead terminals at a bottom thereof, and a lead frame for such a semiconductor apparatus.

BACKGROUND OF THE INVENTION

According to a conventional technology, shown in Japanese Patent Publication Kokai 2000-252389, a chip 306 is adhered on a thin substrate 307. Wires 308 and 309 are bonded to the substrate 307. The substrate 307 is placed in a cavity of a molding die, and is resin-molded. In a resin-molding process, projections 312 are formed a bottom surface of the device. The projections 312 are used as electrodes. A metal layer covering the projections 312 is mechanical removed using a high-speed rotary knife or laser beam.

However, according to the above described conventional technology, the following disadvantage are found:

(1) Since a major part of the electrodes are made of resin, the electrodes have a high stiffness. As a result, bondability between the electrodes and substrate is deteriorated when thermal deformation is occurred on the substrate.

(2) Since BGA type of terminals are formed in a cutting process using a high-speed rotary knife or laser beam, bondability between the terminals and a substrate is deteriorated when such a cutting process is carried out. As a result, bonding wires may be broken.

(3) Since terminals must be divided into individuals, fabricating time is long and fabricating costs get higher.

(4) A substrate and resin mold have different thermal expansion rates, and therefore, a position and height of terminals are changed due to thermal contraction. As a result, the terminals may not be able to be bonded to the substrate.

(5) If a position and height of terminals are changed due to thermal contraction, an electric test for the semiconductor apparatus could not be carried out. That is because; test sockets or test terminals could not be contacted to the terminals of the semiconductor apparatus.

(6) It is impossible to form terminals for a semiconductor apparatus in which a voltage at a bottom surface of a semiconductor pellet.

(7) After a molding resin is hardened, the resin is thermally shrunk. Therefore, a stress is produced between terminals on a semiconductor pellet and terminals on a substrate. As a result, a disconnection may be occurred.

OBJECTS OF THE INVENTION

Accordingly, an object of the present invention is to provide a semiconductor apparatus, in which thermal affection between lead terminals and substrate terminals can be reduced.

Another object of the present invention is to provide a lead frame, in which thermal affection between lead terminals and substrate terminals can be reduced.

Still another object of the present invention is to provide a method for fabricating a semiconductor apparatus, in which thermal affection between lead terminals and substrate terminals can be reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor apparatus includes: a semiconductor pellet having electrodes thereon; a plurality of lead terminals, which electrically connect the electrodes of the semiconductor pellet to terminals formed on a substrate; and a molding member, which is filled around the semiconductor pellet and upper parts of the lead terminals. The plurality of lead terminals are shaped to be elongated strips and are arranged to extend out of the molding member toward the substrate.

According to a second aspect of the present invention, a lead frame includes a die pad on which a semiconductor pellet is placed on; a plurality of lead terminals, which are arranged to surround the die pad and are wired to the semiconductor pellet; a lead terminal supporting bar, which is shaped square to surround the die pad and support the plurality of lead terminals; and a die pad supporting bar, which is formed to extend radially from the die pad and support the die pad. The lead terminal supporting bar is shaped in order that corners thereof, where the die pad supporting bar is crossing thereon, are bent inwardly.

According to a third aspect of the present invention, a method for fabricating a semiconductor apparatus, including: providing a lead frame, comprising a die pad on which a semiconductor pellet is placed, a plurality of lead terminals which are arranged to surround the die pad, and a lead terminal supporting bar which support the lead terminals; bending outer portions of the lead terminals: placing the semiconductor pellet on the die pad, the semiconductor pellet is provided with electrodes thereon; wire-bonding the electrodes and the lead terminals; molding the semiconductor pellet so as to expose ends of the outer portions of the lead terminals; bending the exposed ends of the lead terminals; and cutting the lead terminal supporting bar to release a semiconductor apparatus from the lead frame.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

First Preferred Embodiment

Figure 1:
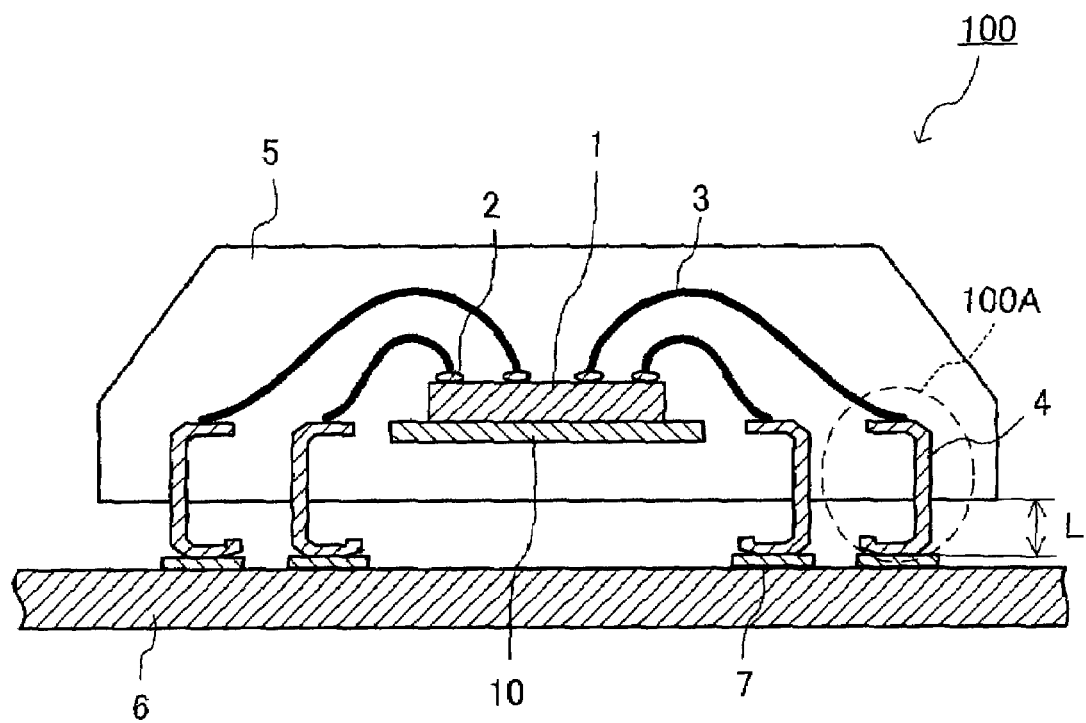
FIG. 1 is a cross-sectional view illustrating a semiconductor apparatus according to a first preferred embodiment of the present invention.
Figure 2A:
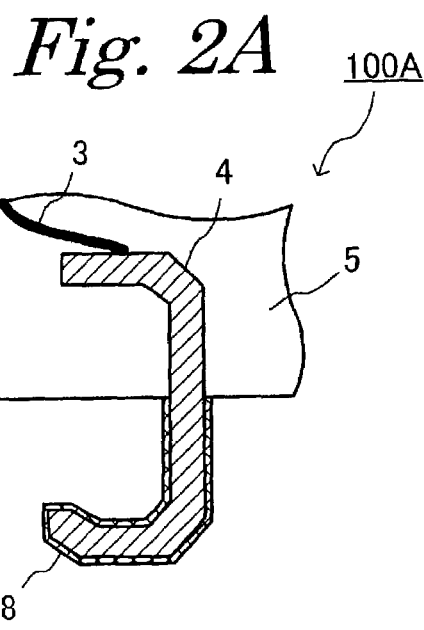
FIG. 2A is an enlarged cross-sectional view (front view) showing a lead terminal used in the first preferred embodiment, shown in FIG. 1.
Figure 2B:
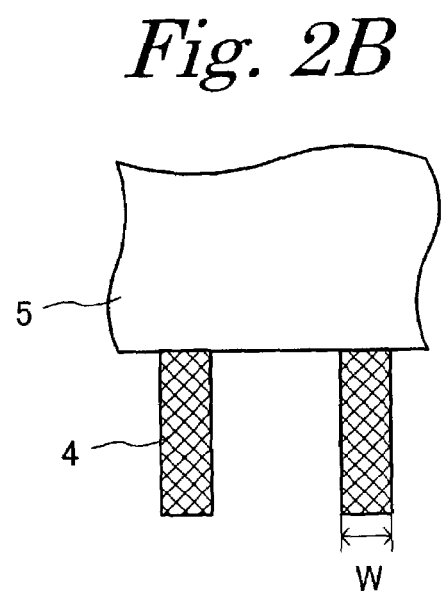
FIG. 2B is an enlarged cross-sectional view (side view) showing a lead terminal used in the first preferred embodiment, shown in FIG. 1.
Figure 2C:
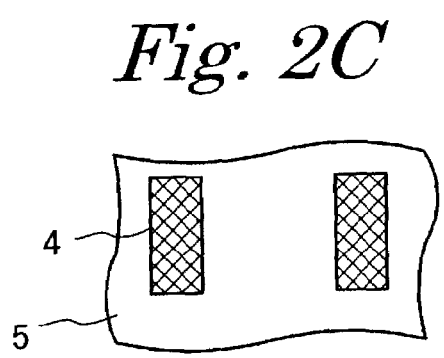
FIG. 2C is an enlarged cross-sectional view (bottom view) showing a lead terminal used in the first preferred embodiment, shown in FIG. 1.

FIG. 1 is a cross-sectional view illustrating a semiconductor apparatus according to a first preferred embodiment of the present invention. FIG. 2A is an enlarged cross-sectional view (front view) showing a lead terminal used in the first preferred embodiment, shown in FIG. 1. FIG. 2B is an enlarged cross-sectional view (side view) showing a lead terminal used in the first preferred embodiment, shown in FIG. 1. FIG. 2C is an enlarged cross-sectional view (bottom view) showing a lead terminal used in the first preferred embodiment, shown in FIG. 1.

A semiconductor apparatus 100 according to the first preferred embodiment is to be mounted on a substrate 6 having substrate terminals 7 thereon. The semiconductor apparatus 100 includes a semiconductor pellet 1, which is arranged above the substrate 6 and has electrodes 2 thereon; a plurality of lead terminals 4, which are electrically connected between the electrodes 2 of the semiconductor pellet 1 and the substrate terminals 7 of the substrate 6; and a molding member 5, which is filled around the semiconductor pellet 1 and upper parts of the lead terminals 4. The plurality of lead terminals 4 are shaped to be elongated strips and are arranged to extend out of the molding member 5 toward the substrate 6.

As described above, the lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

The semiconductor pellet 1 is mounted on a die pad 10 in the resin molding member 5. The lead terminals 4 may be made of iron or copper. The electrodes 2 on the semiconductor pellet 1 are wire-bonded to upper portions of the lead terminals 4 by using bonding wires 3. Upper portions of the lead terminals 4 are bent in order to have upper surface on the same level with the die pad 10. Intermediate portions of the lead terminals 4 extend straight down to the substrate 6. Lower portions of the lead terminals 4 are bent in a perpendicular angle to have horizontal bottom surfaces, which are to be in contact with the substrate terminals 7. The lead terminals 4 are shaped so as not to bent or curve easily in a width direction "W" but bent or curve easily in a thickness direction, which is perpendicular to the width direction "W".

The resin molding member 5 covers the semiconductor pellet 1 and the upper portions of the lead terminals 4. The lower portions of the lead terminals 4, which are exposed from the resin molding member 5, are solder-coated to be connected to the substrate terminals 6 electrically.

The upper portions of the lead terminals 4 according to the present invention can be prevented from being removed because of resin-molding. In addition, protection against corrosion is improved, so that the lead terminals 4 can be connected to the substrate 6 reliably. That is, quality of wire-bonding can be improved.

Preferably, the width "W" of the lead terminals 4 is less than 300 μm when the substrate terminals 7 are arranged with a pitch of 0.4 to 0.5 mm. Further, each of the lead terminals 4 has preferably a length longer than 200 μm. Such a length is measured between a bottom surface of the resin mold member 5 and the substrate terminal 7. According to a BGA type of semiconductor apparatus, a ball terminals has a height of 0.25 mm minimum.

As shown in FIG. 1, the upper portions of the lead terminals 4 are resin-molded, so that the lead terminals 4 can be prevented from being wet.

According to the first preferred embodiment of the present invention, the following advantages can be obtained:

(1) The die pad 10 and the lead terminals 4 are separated via the resin molding member 5, so that no water comes into a space between the pellet 1 and the die pad 10.

(2) The lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

As described above, according to the first preferred embodiment of the present invention, stress generated after the semiconductor apparatus 100 is mounted onto the substrate 6 is absorbed by the lead terminals 4. As a result, the lead terminals 4 are prevented from being removed out of the substrate 6, even if the temperature is changed in an external environment.

Second Preferred Embodiment

Figure 3:
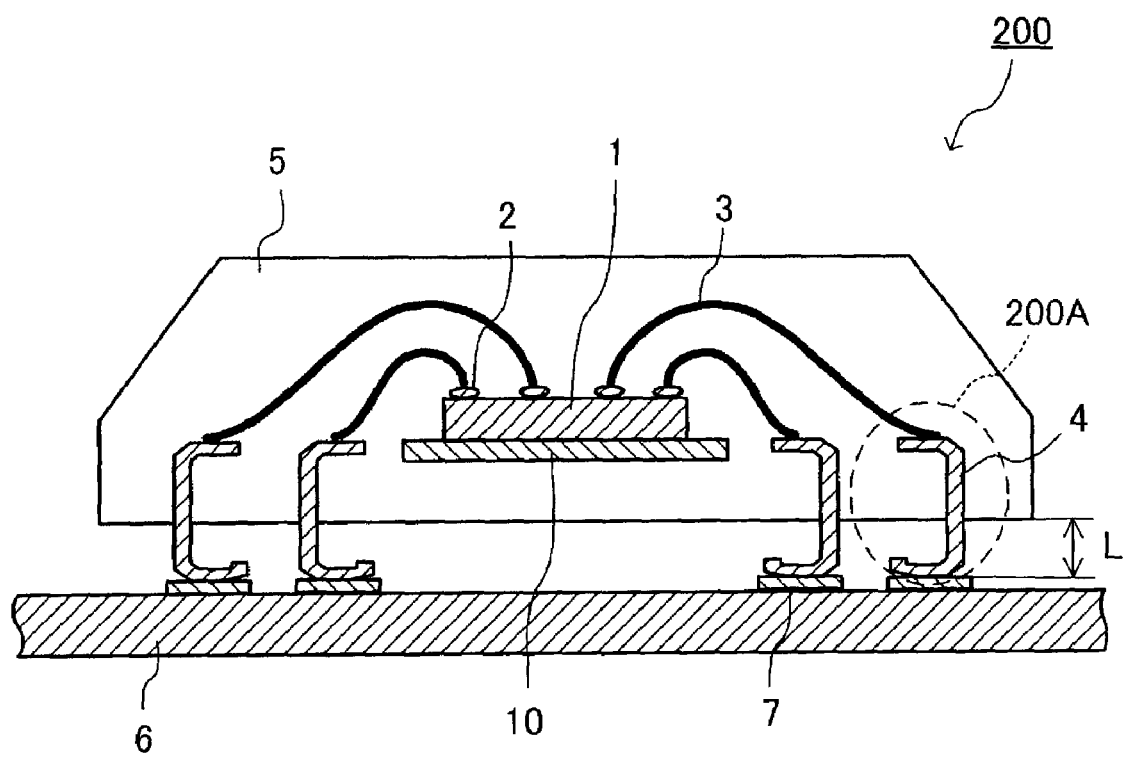
FIG. 3 is a cross-sectional view illustrating a semiconductor apparatus according to a second preferred embodiment of the present invention.
Figure 4A:
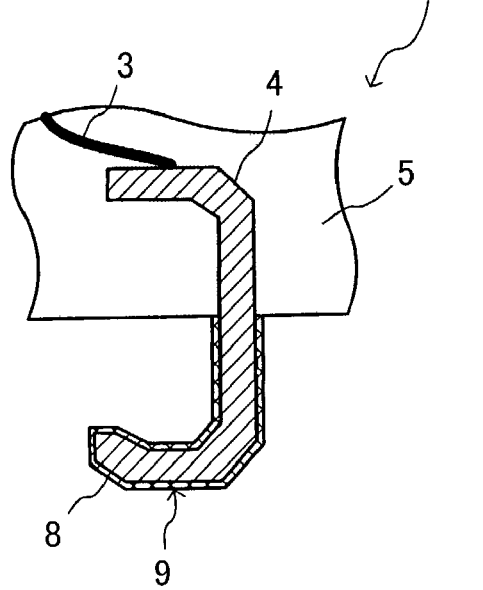
FIG. 4A is an enlarged cross-sectional view (front view) showing a lead terminal used in the second preferred embodiment, shown in FIG. 3.
Figure 4B:
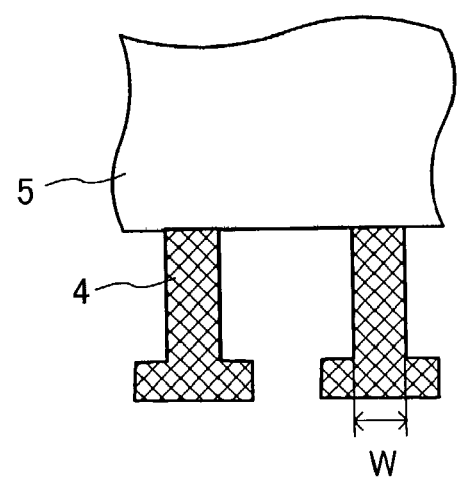
FIG. 4B is an enlarged cross-sectional view (side view) showing a lead terminal used in the second preferred embodiment, shown in FIG. 3.
Figure 4C:
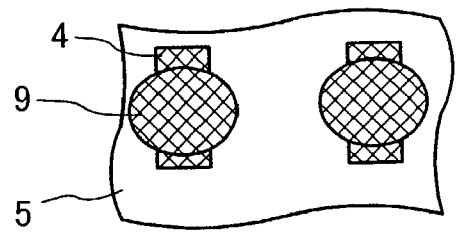
FIG. 4C is an enlarged cross-sectional view (bottom view) showing a lead terminal used in the second preferred embodiment, shown in FIG. 3.

FIG. 3 is a cross-sectional view illustrating a semiconductor apparatus according to a second preferred embodiment of the present invention. FIG. 4A is an enlarged cross-sectional view (front view) showing a lead terminal used in the second preferred embodiment, shown in FIG. 3. FIG. 4B is an enlarged cross-sectional view (side view) showing a lead terminal used in the second preferred embodiment, shown in FIG. 3. FIG. 4C is an enlarged cross-sectional view (bottom view) showing a lead terminal used in the second preferred embodiment, shown in FIG. 3.

A semiconductor apparatus 200 according to the second preferred embodiment is to be mounted on a substrate 6 having substrate terminals 7 thereon. The semiconductor apparatus 200 includes a semiconductor pellet 1, which is arranged above the substrate 6 and has electrodes 2 thereon; a plurality of lead terminals 4, which are electrically connected between the electrodes 2 of the semiconductor pellet 1 and the substrate terminals 7 of the substrate 6; and a molding member 5, which is filled around the semiconductor pellet 1 and upper parts of the lead terminals 4. The plurality of lead terminals 4 are shaped to be elongated strips and are arranged to extend out of the molding member 5 toward the substrate 6.

As described above, the lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

The semiconductor pellet 1 is mounted on a die pad 10 in the resin molding member 5. The lead terminals 4 may be made of iron or copper. The electrodes 2 on the semiconductor pellet 1 are wire-bonded to upper portions of the lead terminals 4 by using bonding wires 3. Upper portions of the lead terminals 4 are bent in order to have upper surface on the same level with the die pad 10. Intermediate portions of the lead terminals 4 extend straight down to the substrate 6. Lower portions of the lead terminals 4 are bent in a perpendicular angle to have horizontal bottom surfaces, which are to be in contact with the substrate terminals 7. The lead terminals 4 are shaped so as not to bent or curve easily in a width direction "W" but bent or curve easily in a thickness direction, which is perpendicular to the width direction "W".

The resin molding member 5 covers the semiconductor pellet 1 and the upper portions of the lead terminals 4. The lower portions of the lead terminals 4, which are exposed from the resin molding member 5, are solder-coated to be connected to the substrate terminals 6 electrically. Each of the lead terminals 4 has a bottom surface 9, which is shaped to be round, so as to increase an area to be in contact with the substrate terminal 7. A diameter of the round-shaped bottom surface 9 of the lead terminal 4 is larger than the width "W"

The upper portions of the lead terminals 4 according to the present invention can be prevented from being removed because of resin-molding. In addition, protection against corrosion is improved, so that the lead terminals 4 can be connected to the substrate 6 reliably. That is, quality of wire-bonding can be improved.

Preferably, the width "W" of the lead terminals 4 is less than 300 μm when the substrate terminals 7 are arranged with a pitch of 0.4 to 0.5 mm. Further, each of the lead terminals 4 has preferably a length longer than 200 μm. Such a length is measured between a bottom surface of the resin mold member 5 and the substrate terminal 7.

As shown in FIG. 3, the upper portions of the lead terminals 4 are resin-molded, so that the lead terminals 4 can be prevented from being wet.

According to the second preferred embodiment of the present invention, the following advantages can be obtained:

(1) The die pad 10 and the lead terminals 4 are separated via the resin molding member 5, so that no water comes into a space between the pellet 1 and the die pad 10.

(2) Since the bottom surfaces 9 of the lead terminals 4 increase contact areas to the substrate terminals 7, the lead terminals 4 and the substrate terminals 7 are bonded reliably, and therefore; the lead terminals 4 are prevented from being removed out of the substrate 6.

(3) The lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

As described above, according to the second preferred embodiment of the present invention, in addition to the features of the first preferred embodiment, the bottom surfaces 9 of the lead terminals 4 increase contact areas to the substrate terminals 7, so that the lead terminals 4 and the substrate terminals 7 are bonded reliably. As a result, the lead terminals 4 are prevented from being removed out of the substrate 6. The semiconductor apparatus 200 according to the second preferred embodiment is especially useful to a device, such as a portable phone.

Third Preferred Embodiment

Figure 5:
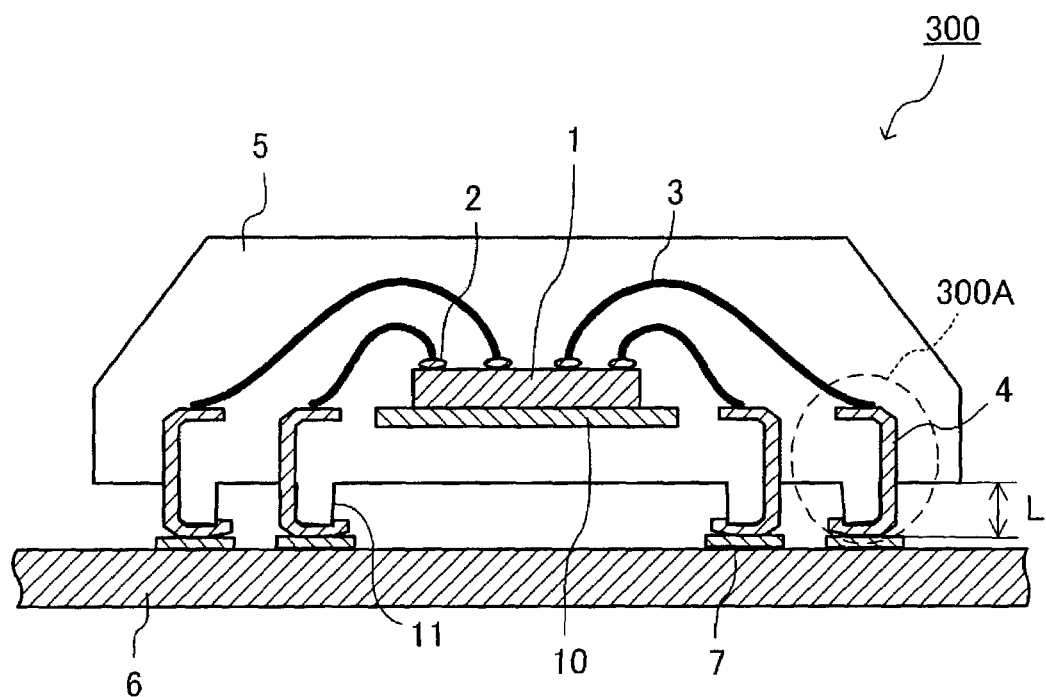
FIG. 5 is a cross-sectional view illustrating a semiconductor apparatus according to a third preferred embodiment of the present invention.
Figure 6A:
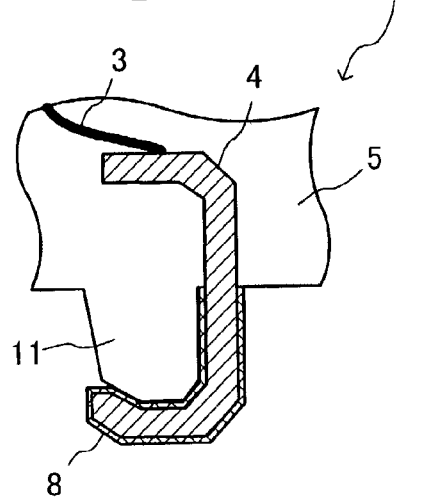
FIG. 6A is an enlarged cross-sectional view (front view) showing a lead terminal used in the third preferred embodiment, shown in FIG. 5.
Figure 6B:
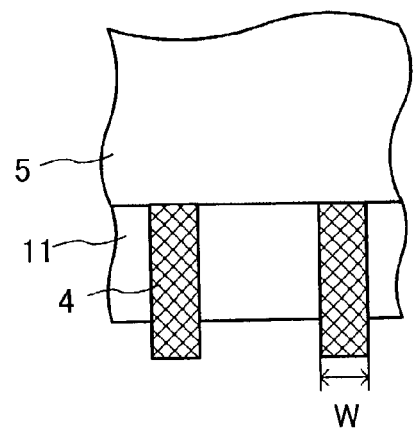
FIG. 6B is an enlarged cross-sectional view (side view) showing a lead terminal used in the third preferred embodiment, shown in FIG. 5.
Figure 6C:
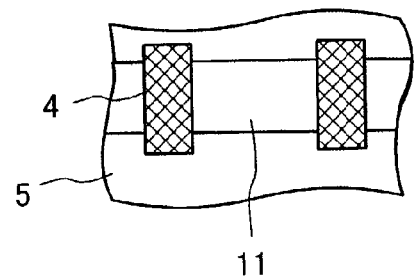
FIG. 6C is an enlarged cross-sectional view (bottom view) showing a lead terminal used in the third preferred embodiment, shown in FIG. 5

FIG. 5 is a cross-sectional view illustrating a semiconductor apparatus according to a third preferred embodiment of the present invention. FIG. 6A is an enlarged cross-sectional view (front view) showing a lead terminal used in the third preferred embodiment, shown in FIG. 5. FIG. 6B is an enlarged cross-sectional view (side view) showing a lead terminal used in the third preferred embodiment, shown in FIG. 5. FIG. 6C is an enlarged cross-sectional view (bottom view) showing a lead terminal used in the third preferred embodiment, shown in FIG. 5

A semiconductor apparatus 300 according to the third preferred embodiment is to be mounted on a substrate 6 having substrate terminals 7 thereon. The semiconductor apparatus 300 includes a semiconductor pellet 1, which is arranged above the substrate 6 and has electrodes 2 thereon; a plurality of lead terminals 4, which are electrically connected between the electrodes 2 of the semiconductor pellet 1 and the substrate terminals 7 of the substrate 6; and a molding member 5, which is filled around the semiconductor pellet 1 and upper parts of the lead terminals 4. The plurality of lead terminals 4 are shaped to be elongated strips and are arranged to extend out of the molding member 5 toward the substrate 6.

As described above, the lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

The semiconductor pellet 1 is mounted on a die pad 10 in the resin molding member 5. The lead terminals 4 may be made of iron or copper. The electrodes 2 on the semiconductor pellet 1 are wire-bonded to upper portions of the lead terminals 4 by using bonding wires 3. Upper portions of the lead terminals 4 are bent in order to have upper surface on the same level with the die pad 10. Intermediate portions of the lead terminals 4 extend straight down to the substrate 6. Lower portions of the lead terminals 4 are bent in a perpendicular angle to have horizontal bottom surfaces, which are to be in contact with the substrate terminals 7. The lead terminals 4 are shaped so as not to bent or curve easily in a width direction "W" but bent or curve easily in a thickness direction, which is perpendicular to the width direction "W".

The resin molding member 5 covers the semiconductor pellet 1 and the upper portions of the lead terminals 4. The lower portions of the lead terminals 4, which are exposed from the resin molding member 5, are solder-coated to be connected to the substrate terminals 6 electrically.

The resin-molding member 5 is provided with projected portions 11 at a bottom thereof, along which the lead terminals 4 are bent or curved. The projected portions 11 are shaped to have a height so that the lead terminals 4 and the substrate terminals 7 are reliably bonded to each other. The projected portions 11 also shaped to have a width and thickness to provide enough strength to support the semiconductor pellet 1.

The upper portions of the lead terminals 4 according to the present invention can be prevented from being removed because of resin-molding. In addition, protection against corrosion is improved, so that the lead terminals 4 can be connected to the substrate 6 reliably. That is, quality of wire-bonding can be improved.

Preferably, the width "W" of the lead terminals 4 is less than 300 μm. Further, each of the lead terminals 4 has preferably a length longer than 200 μm. Such a length is measured between a bottom surface of the resin mold member 5 and the substrate terminal 7.

As shown in FIG. 5, the upper portions of the lead terminals 4 are resin-molded, so that the lead terminals 4 can be prevented from being wet.

According to the third preferred embodiment of the present invention, the following advantages can be obtained:

(1) The die pad 10 and the lead terminals 4 are separated via the resin molding member 5, so that no water comes into a space between the pellet 1 and the die pad 10.

(2) The projected portions 11 of the resin-molding member 5 function to increase or improve mechanical strength of the lead terminals, so that the lead terminals 4 can be maintained their original shapes.

(3) The lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

(4) When the semiconductor apparatus 300 is mounted on the substrate 6, the lead terminals 4 are maintained their connecting areas flat and are elastic-deformed entirely until the projecting portions 11 are bumped into the substrate terminals 7 via the lead terminals 4. Namely, the lead terminals are elastic-deformed uniformly and bonded onto the substrate terminals 7. As a result, the lead terminals 4 are prevented from being extraordinarily changed in shape even if a large amount of pressure is applied from the semiconductor apparatus 300 to the substrate 6. And therefore, the lead terminals 4 are prevented from being peeled off the substrate terminals 6.

As described above, according to the third preferred embodiment of the present invention, in addition to the features of the first and second preferred embodiments, the projected portions 11 of the resin-molding member 5 absorb unevenness of heights of the lead terminals 4. As a result, connecting areas of the lead terminals 4 are in the same level, and therefore, all the lead terminals 4 can be bonded to the substrate terminals 7 uniformly.

Fourth Preferred Embodiment

Figure 7:
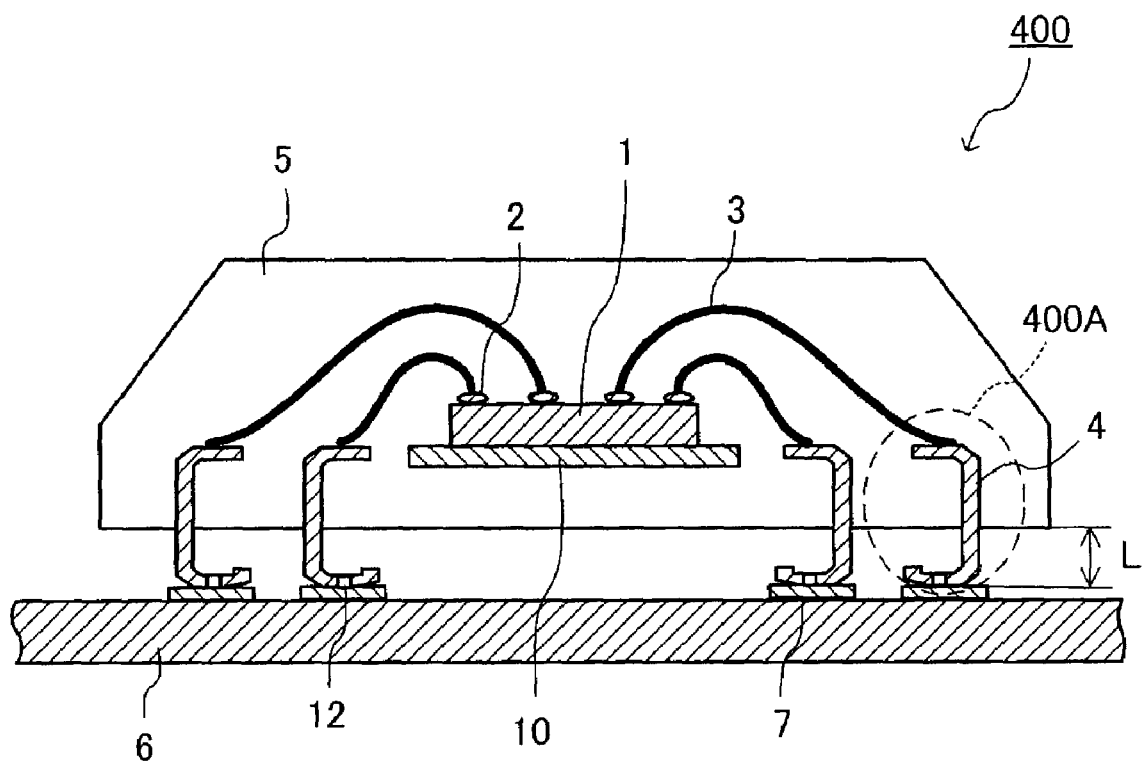
FIG. 7 is a cross-sectional view illustrating a semiconductor apparatus according to a fourth preferred embodiment of the present invention.
Figure 8A:
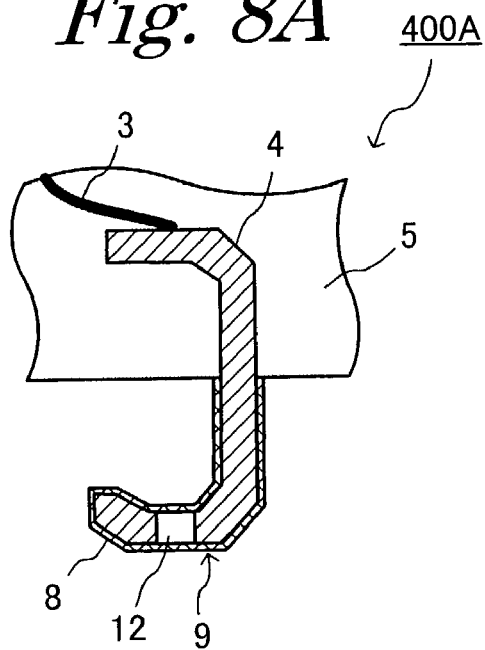
FIG. 8A is an enlarged cross-sectional view (front view) showing a lead terminal used in the fourth preferred embodiment, shown in FIG. 7.
Figure 8B:
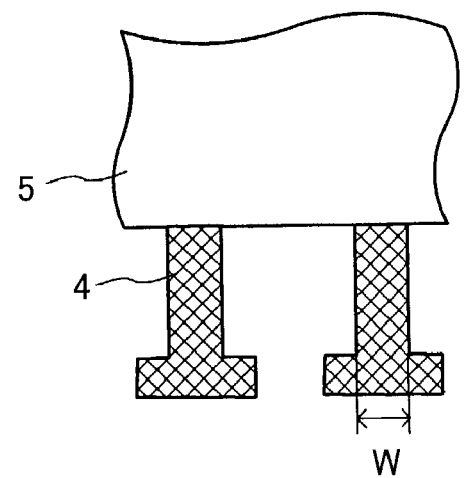
FIG. 8B is an enlarged cross-sectional view (side view) showing a lead terminal used in the fourth preferred embodiment, shown in FIG. 7.
Figure 8C:
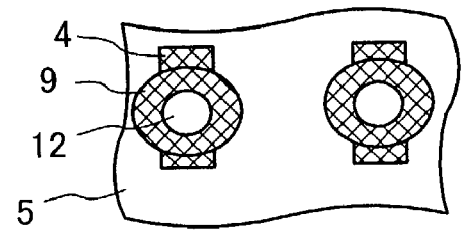
FIG. 8C is an enlarged cross-sectional view (bottom view) showing a lead terminal used in the fourth preferred embodiment, shown in FIG. 7.

FIG. 7 is a cross-sectional view illustrating a semiconductor apparatus according to a fourth preferred embodiment of the present invention. FIG. 8A is an enlarged cross-sectional view (front view) showing a lead terminal used in the fourth preferred embodiment, shown in FIG. 7. FIG. 8B is an enlarged cross-sectional view (side view) showing a lead terminal used in the fourth preferred embodiment, shown in FIG. 7. FIG. 8C is an enlarged cross-sectional view (bottom view) showing a lead terminal used in the fourth preferred embodiment, shown in FIG. 7.

A semiconductor apparatus 400 according to the fourth preferred embodiment is designed to be mounted on to a substrate 6 having substrate terminals 7 thereon. The semiconductor apparatus 400 includes a semiconductor pellet 1, which is arranged above the substrate 6 and has electrodes 2 thereon; a plurality of lead terminals 4, which are electrically connected between the electrodes 2 of the semiconductor pellet 1 and the substrate terminals 7 of the substrate 6; and a molding member 5, which is filled around the semiconductor pellet 1 and upper parts of the lead terminals 4. The plurality of lead terminals 4 are shaped to be elongated strips and are arranged to extend out of the molding member 5 toward the substrate 6.

As described above, the lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

The semiconductor pellet 1 is mounted on a die pad 10 in the resin molding member 5. The lead terminals 4 may be made of iron or copper. The electrodes 2 on the semiconductor pellet 1 are wire-bonded to upper portions of the lead terminals 4 by using bonding wires 3. Upper portions of the lead terminals 4 are bent in order to have upper surface on the same level with the die pad 10. Intermediate portions of the lead terminals 4 extend straight down to the substrate 6. Lower portions of the lead terminals 4 are bent in a perpendicular angle to have horizontal bottom surfaces, which are to be in contact with the substrate terminals 7. The lead terminals 4 are shaped so as not to bent or curve easily in a width direction "W" but bent or curve easily in a thickness direction, which is perpendicular to the width direction "W".

The resin molding member 5 covers the semiconductor pellet 1 and the upper portions of the lead terminals 4. The lower portions of the lead terminals 4, which are exposed from the resin molding member 5, are solder-coated to be connected to the substrate terminals 6 electrically. Each of the lead terminals 4 has a bottom surface 9, which is shaped to be round, so as to increase an area to be in contact with the substrate terminal 7. A diameter of the round-shaped bottom surface 9 of the lead terminal 4 is larger than the width "W".

The bottom surface (contact surface) 9 of each of the lead terminals 4 is provided with an opening 12 at the center.

The upper portions of the lead terminals 4 according to the present invention can be prevented from being removed because of resin-molding. In addition, protection against corrosion is improved, so that the lead terminals 4 can be connected to the substrate 6 reliably. That is, quality of wire-bonding can be improved.

Preferably, the width "W" of the lead terminals 4 is less than 300 μm when the substrate terminals 7 are arranged with a pitch of 0.4 to 0.5 mm. Further, each of the lead terminals 4 has preferably a length longer than 200 μm. Such a length is measured between a bottom surface of the resin mold member 5 and the substrate terminal 7.

As shown in FIG. 7, the upper portions of the lead terminals 4 are resin-molded, so that the lead terminals 4 can be prevented from being wet.

According to the fourth preferred embodiment of the present invention, the following advantages can be obtained:

(1) The die pad 10 and the lead terminals 4 are separated via the resin molding member 5, so that no water comes into a space between the pellet 1 and the die pad 10.

(2) Since the bottom surfaces 9 of the lead terminals 4 increase contact areas to the substrate terminals 7, the lead terminals 4 and the substrate terminals 7 are bonded reliably, and therefore; the lead terminals 4 are prevented from being removed out of the substrate 6.

(3) The lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

(4) Since the bottom surfaces 9 of the lead terminals 4 increase contact areas to the substrate terminals 7, the lead terminals 4 and the substrate terminals 7 are bonded reliably.

(5) In an electric test of the semiconductor apparatus 400, socket terminals or test terminals can be inserted into the openings 12, so that the socket terminals and the lead terminals can be in contact with each other reliably.

As described above, according to the fourth preferred embodiment of the present invention, in addition to the features of the second preferred embodiment, socket terminals or test terminals can be inserted into the openings 12 in an electric test, so that the socket terminals and the lead terminals can be in contact with each other reliably. And therefore, a connecting error in an electric test is prevented.

Fifth Preferred Embodiment

Figure 9:
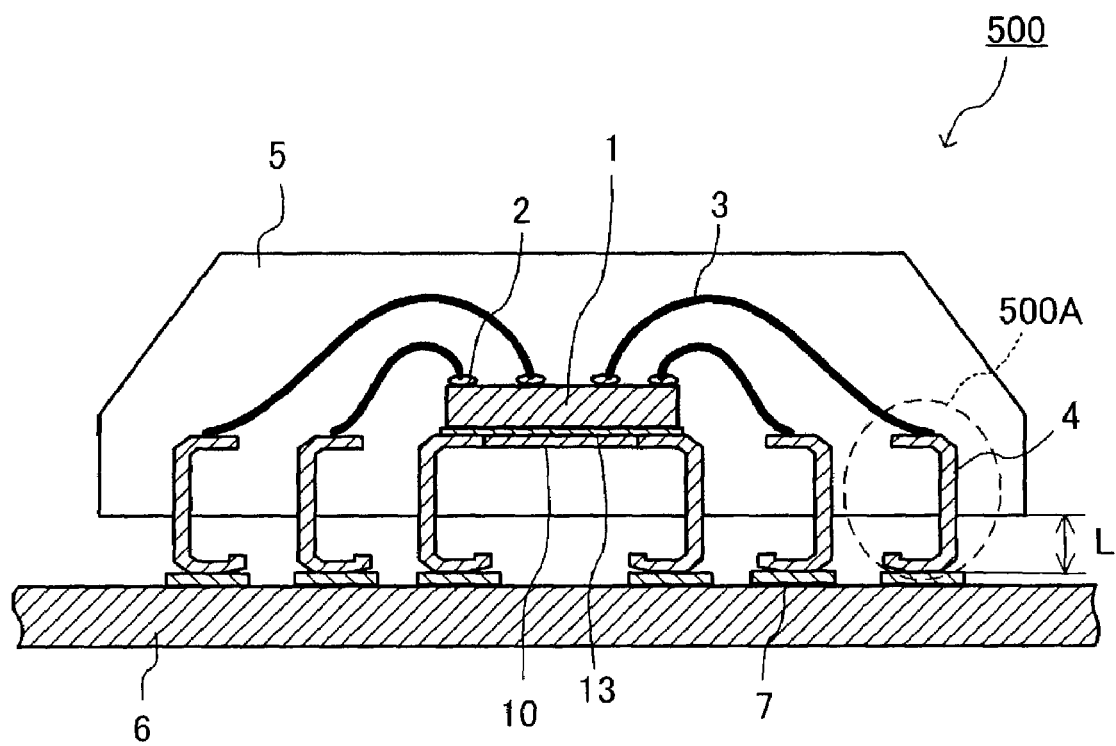
FIG. 9 is a cross-sectional view illustrating a semiconductor apparatus according to a fifth preferred embodiment of the present invention.
Figure 10A:
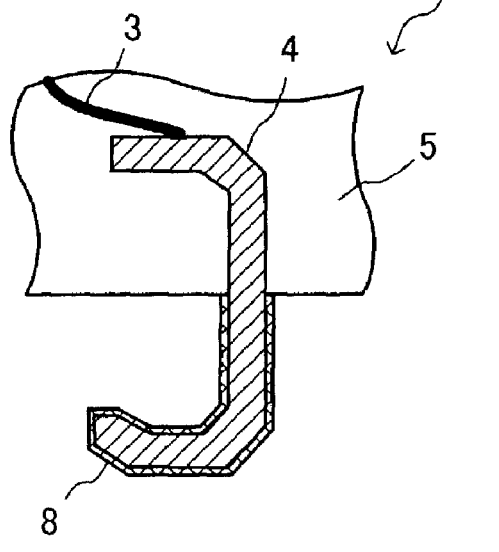
FIG. 10A is an enlarged cross-sectional view (front view) showing a lead terminal used in the fifth preferred embodiment, shown in FIG. 9.
Figure 10B:
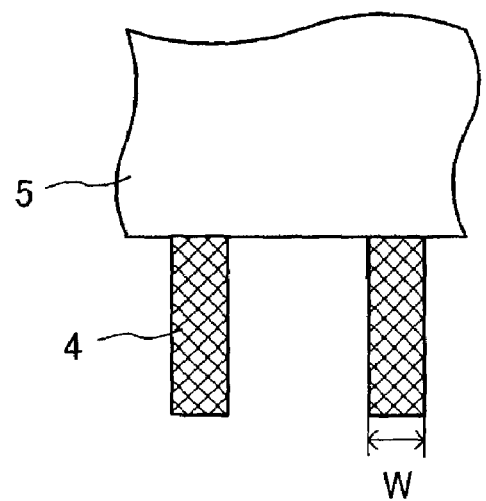
FIG. 10B is an enlarged cross-sectional view (side view) showing a lead terminal used in the fifth preferred embodiment, shown in FIG. 9.
Figure 10C:
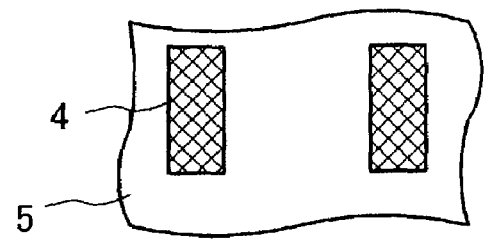
FIG. 10C is an enlarged cross-sectional view (bottom view) showing a lead terminal used in the fifth preferred embodiment, shown in FIG. 9.

FIG. 9 is a cross-sectional view illustrating a semiconductor apparatus according to a fifth preferred embodiment of the present invention. FIG. 10A is an enlarged cross-sectional view (front view) showing a lead terminal used in the fifth preferred embodiment, shown in FIG. 9. FIG. 10B is an enlarged cross-sectional view (side view) showing a lead terminal used in the fifth preferred embodiment, shown in FIG. 9. FIG. 10C is an enlarged cross-sectional view (bottom view) showing a lead terminal used in the fifth preferred embodiment, shown in FIG. 9.

A semiconductor apparatus 500 according to the fifth preferred embodiment is to be mounted on a substrate 6 having substrate terminals 7 thereon. The semiconductor apparatus 100 includes a semiconductor pellet 1, which is arranged above the substrate 6 and has electrodes 2 thereon; a plurality of lead terminals 4, which are electrically connected between the electrodes 2 of the semiconductor pellet 1 and the substrate terminals 7 of the substrate 6; and a molding member 5, which is filled around the semiconductor pellet 1 and upper parts of the lead terminals 4. The plurality of lead terminals 4 are shaped to be elongated strips and are arranged to extend out of the molding member 5 toward the substrate 6.

As described above, the lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

The semiconductor pellet 1 is mounted on a die pad 10 in the resin molding member 5. The lead terminals 4 may be made of iron or copper. The electrodes 2 on the semiconductor pellet 1 are wire-bonded to upper portions of the lead terminals 4 by using bonding wires 3. Upper portions of the lead terminals 4 are bent in order to have upper surface on the same level with the die pad 10. Intermediate portions of the lead terminals 4 extend straight down to the substrate 6. Lower portions of the lead terminals 4 are bent in a perpendicular angle to have horizontal bottom surfaces, which are to be in contact with the substrate terminals 7. The lead terminals 4 are shaped so as not to bent or curve easily in a width direction "W" but bent or curve easily in a thickness direction, which is perpendicular to the width direction "W".

The resin molding member 5 covers the semiconductor pellet 1 and the upper portions of the lead terminals 4. The lower portions of the lead terminals 4, which are exposed from the resin molding member 5, are solder-coated to be connected to the substrate terminals 6 electrically.

The upper portions of the lead terminals 4 according to the present invention can be prevented from being removed because of resin-molding. In addition, protection against corrosion is improved, so that the lead terminals 4 can be connected to the substrate 6 reliably. That is, quality of wire-bonding can be improved.

Preferably, the width "W" of the lead terminals 4 is less than 300 μm. Further, each of the lead terminals 4 has preferably a length longer than 200 μm. Such a length is measured between a bottom surface of the resin mold member 5 and the substrate terminal 7.

As shown in FIG. 9, the upper portions of the lead terminals 4 are resin-molded, so that the lead terminals 4 can be prevented from being wet.

A major feature of the present embodiment is that lead terminals 4 are arranged below the semiconductor pellet 1. Upper surfaces of the lead terminals 4 are connected to a bottom surface of the semiconductor pellet 1 via a conductive adhesive layer 13.

According to the fifth preferred embodiment of the present invention, the following advantages can be obtained:

(1) The die pad 10 and the lead terminals 4 are separated via the resin molding member 5, so that no water comes into a space between the pellet 1 and the die pad 10.

(2) Since lead terminals 4 are arranged below the semiconductor pellet 1, and upper surfaces of the lead terminals 4 are connected to a bottom surface of the semiconductor pellet 1 via a conductive adhesive layer 13, the bottom surface or rear surface of the semiconductor pellet 1 can be controlled in voltage easily through the lead terminals 4. This feature is especially useful for a SOI (Silicon On Insulator) type of semiconductor apparatus.

(3) The lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

(4) Since the semiconductor apparatus includes lead terminals used for controlling the bottom surface of the semiconductor pellet 1, the bottom surface of the semiconductor pellet 1 can be controlled in voltage easily.

As described above, according to the fifth preferred embodiment of the present invention, in addition to the features of the first preferred embodiment, the bottom surface of the semiconductor pellet 1 can be controlled in voltage easily through the lead terminals 4.

Sixth Preferred Embodiment

Figure 11:
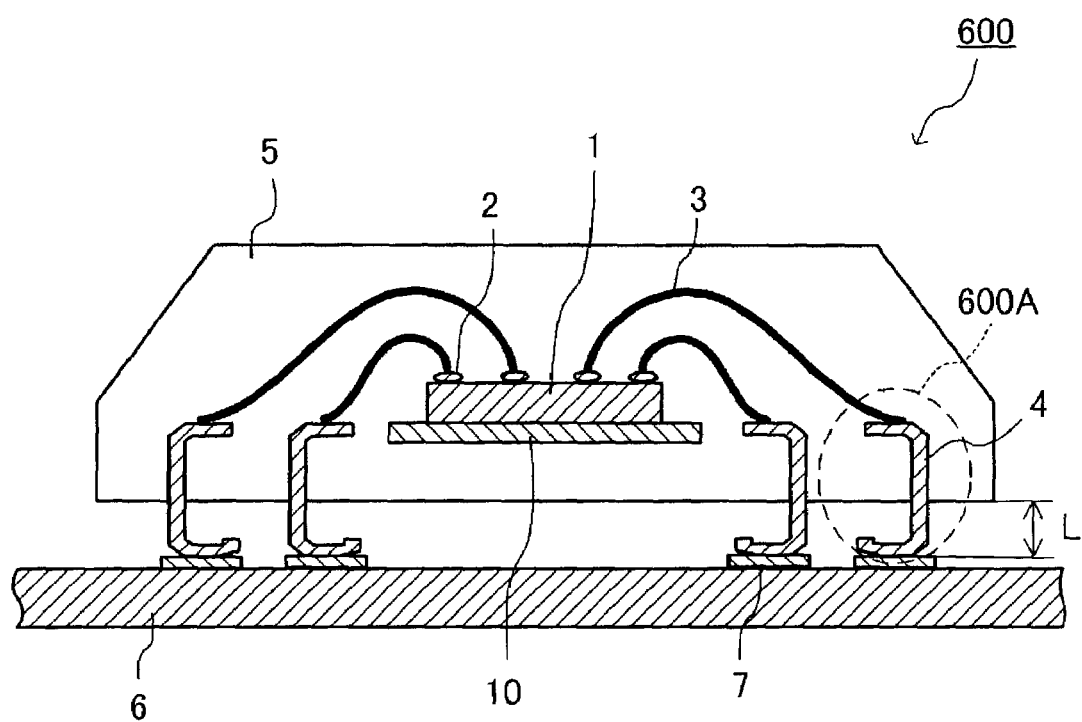
FIG. 11 is a cross-sectional view illustrating a semiconductor apparatus according to a sixth preferred embodiment of the present invention.
Figure 12A:
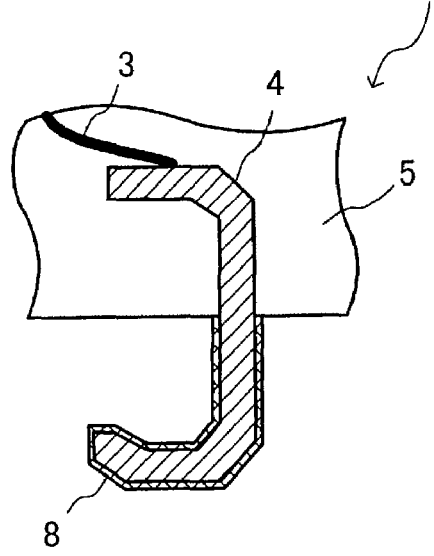
FIG. 12A is an enlarged cross-sectional view (front view) showing a lead terminal used in the sixth preferred embodiment, shown in FIG. 11.
Figure 12B:
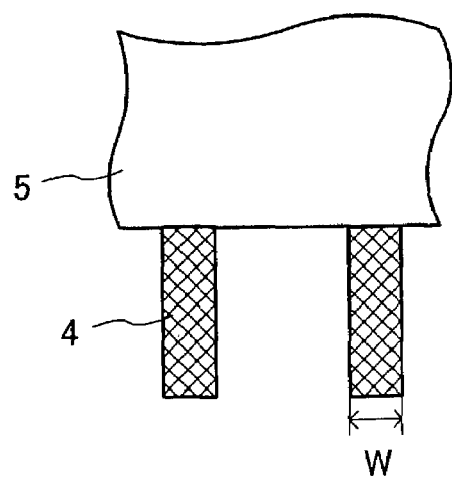
FIG. 12B is an enlarged cross-sectional view (side view) showing a lead terminal used in the sixth preferred embodiment, shown in FIG. 11.
Figure 12C:
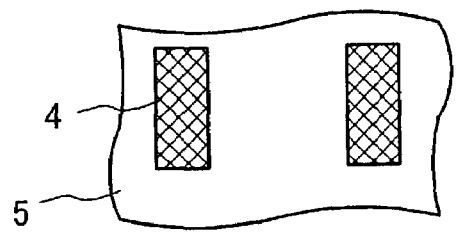
FIG. 12C is an enlarged cross-sectional view (bottom view) showing a lead terminal used in the sixth preferred embodiment, shown in FIG. 11.
Figure 13:
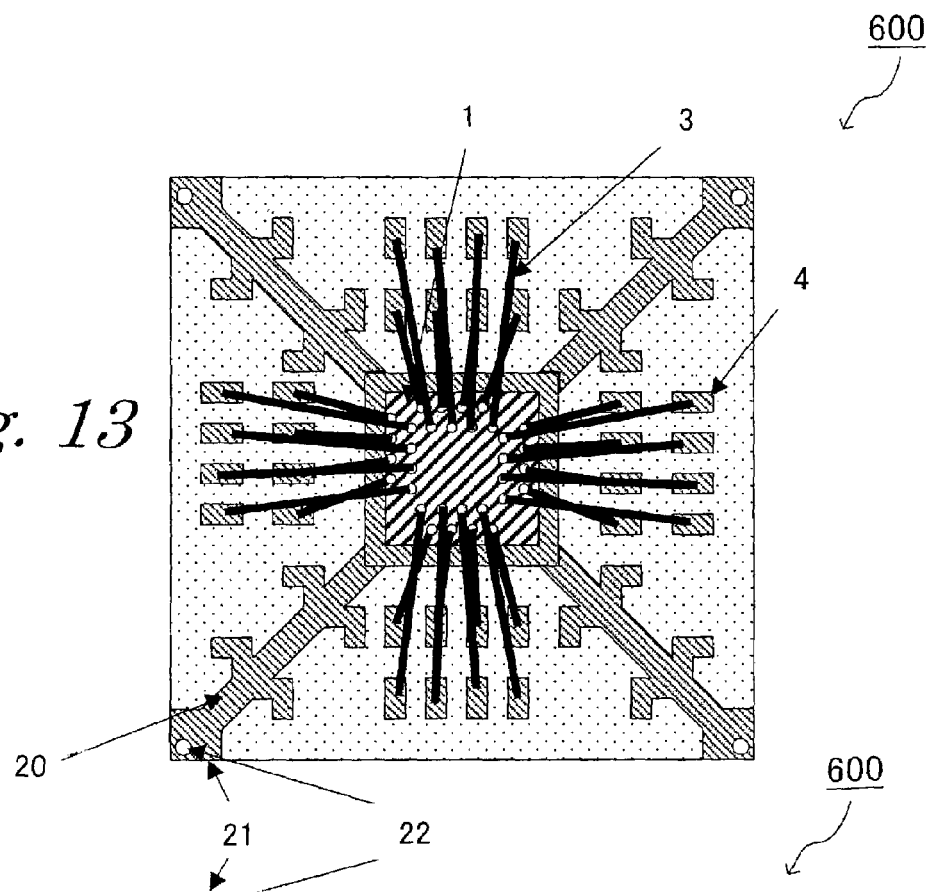
FIG. 13 is a plan view illustrating a semiconductor apparatus according to the sixth preferred embodiment, shown in FIG. 11.
Figure 14:
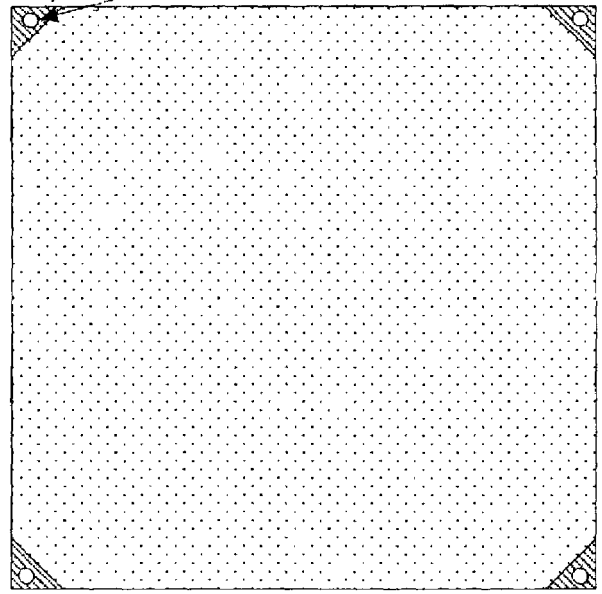
FIG. 14 is a rear view illustrating a semiconductor apparatus according to the sixth preferred embodiment, shown in FIG. 11.

FIG. 11 is a cross-sectional view illustrating a semiconductor apparatus according to a sixth preferred embodiment of the present invention. FIG. 12A is an enlarged cross-sectional view (front view) showing a lead terminal used in the sixth preferred embodiment, shown in FIG. 11. FIG. 12B is an enlarged cross-sectional view (side view) showing a lead terminal used in the sixth preferred embodiment, shown in FIG. 11. FIG. 12C is an enlarged cross-sectional view (bottom view) showing a lead terminal used in the sixth preferred embodiment, shown in FIG. 11. FIG. 13 is a plan view illustrating a semiconductor apparatus according to the sixth preferred embodiment, shown in FIG. 11. FIG. 14 is a rear view illustrating a semiconductor apparatus according to the sixth preferred embodiment, shown in FIG. 11.

A semiconductor apparatus 600 according to the first preferred embodiment is to be mounted on a substrate 6 having substrate terminals 7 thereon. The semiconductor apparatus 600 includes a semiconductor pellet 1, which is arranged above the substrate 6 and has electrodes 2 thereon; a plurality of lead terminals 4, which are electrically connected between the electrodes 2 of the semiconductor pellet 1 and the substrate terminals 7 of the substrate 6; and a molding member 5, which is filled around the semiconductor pellet 1 and upper parts of the lead terminals 4. The plurality of lead terminals 4 are shaped to be elongated strips and are arranged to extend out of the molding member 5 toward the substrate 6.

As described above, the lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

The semiconductor pellet 1 is mounted on a die pad 10 in the resin molding member 5. The lead terminals 4 may be made of iron or copper. The electrodes 2 on the semiconductor pellet 1 are wire-bonded to upper portions of the lead terminals 4 by using bonding wires 3. Upper portions of the lead terminals 4 are bent in order to have upper surface on the same level with the die pad 10. Intermediate portions of the lead terminals 4 extend straight down to the substrate 6. Lower portions of the lead terminals 4 are bent in a perpendicular angle to have horizontal bottom surfaces, which are to be in contact with the substrate terminals 7. The lead terminals 4 are shaped so as not to bent or curve easily in a width direction "W" but bent or curve easily in a thickness direction, which is perpendicular to the width direction "W".

The resin molding member 5 covers the semiconductor pellet 1 and the upper portions of the lead terminals 4. The lower portions of the lead terminals 4, which are exposed from the resin molding member 5, are solder-coated to be connected to the substrate terminals 6 electrically.

The upper portions of the lead terminals 4 according to the present invention can be prevented from being removed because of resin-molding. In addition, protection against corrosion is improved, so that the lead terminals 4 can be connected to the substrate 6 reliably. That is, quality of wire-bonding can be improved.

Preferably, the width "W" of the lead terminals 4 is less than 300 μm. Further, each of the lead terminals 4 has preferably a length longer than 200 μm. Such a length is measured between a bottom surface of the resin mold member 5 and the substrate terminal 7.

As shown in FIG. 11, the upper portions of the lead terminals 4 are resin-molded, so that the lead terminals 4 can be prevented from being wet.

As shown in FIG. 13, the die pad 10 is supported by support bars 20, which are extending in diagonal directions to corners of the semiconductor apparatus 600. Each of the support bars 20 is provided at its outer end with a fixing portion 21. Each fixing portion 21 is provided with an opening 22 for alignment.

According to the sixth preferred embodiment of the present invention, the following advantages can be obtained:

(1) The die pad 10 and the lead terminals 4 are separated via the resin molding member 5, so that no water comes into a space between the pellet 1 and the die pad 10.

(2) The openings 22 for alignment are formed at the corners of the semiconductor apparatus, so that the lead terminals 4 and substrate terminals 7 can be aligned precisely.

(3) The lead terminals 4 are shaped to be elongated strips so that the lead terminals 4 are flexible. And therefore, the lead terminals 4 can absorb undesired stress generated due to the difference of thermal expansion rates between the resin molding member 5 and the substrate 6. In other words, the lead terminals 4 may be shaped to be thin, narrow or slender to be flexible enough to absorb undesired stress generated between the resin molding member 5 and the substrate 6.

(4) Alignment accuracy between the lead terminals 4 and the substrate terminals 7 is improved, because the semiconductor apparatus 600 is aligned to the substrate 6 using the openings 22 as points of origin, formed at every corner of the semiconductor apparatus 600.

As described above, according to the sixth preferred embodiment of the present invention, in addition to the features of the first preferred embodiment, the lead terminals 4 can be aligned to the substrate terminals 7 precisely, even if the substrate terminals 7 are arranged with a narrow pitch.

Seventh Preferred Embodiment

Figure 15A:
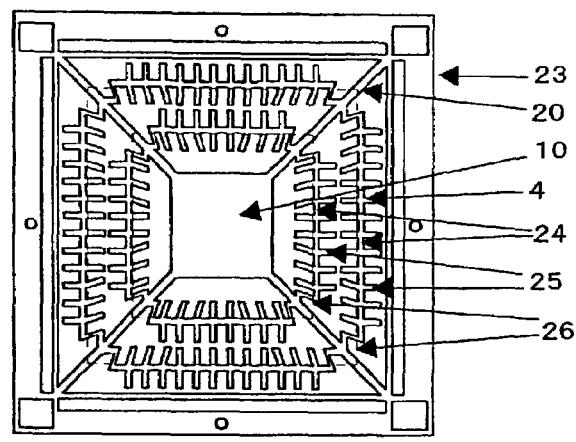
FIG. 15A is a plan view illustrating a lead frame used for fabricating a semiconductor apparatus according to a seventh preferred embodiment of the present invention.
Figure 15B:
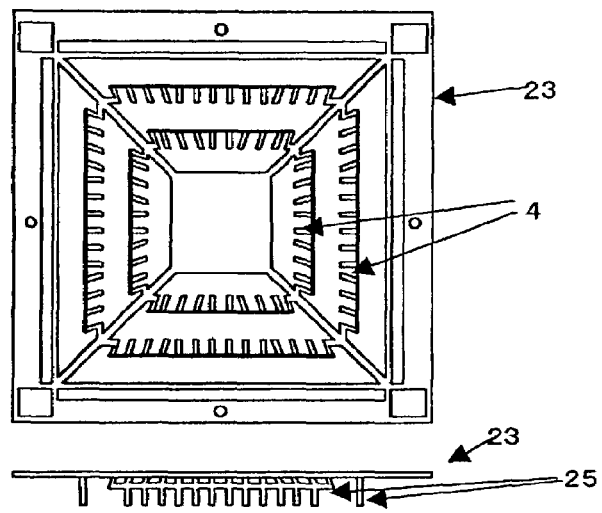
FIG. 15B includes a plan view and a front view showing a lead frame under fabrication process according to the seventh preferred embodiment.
Figure 15C:
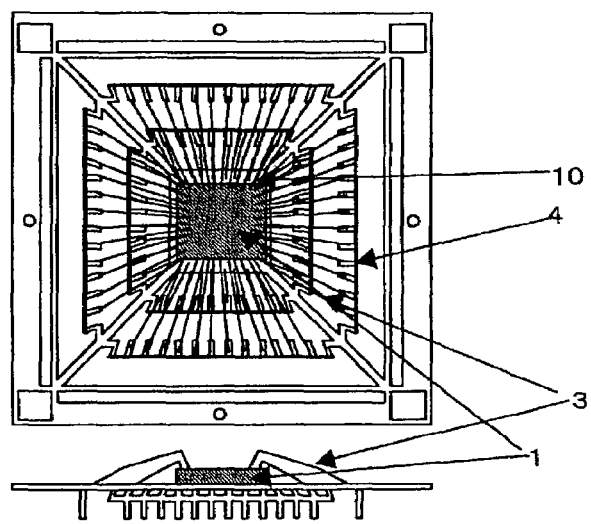
FIG. 15C includes a plan view and a front view showing a lead frame under fabrication process according to the seventh preferred embodiment.

FIG. 15A is a plan view illustrating a lead frame used for fabricating a semiconductor apparatus according to a seventh preferred embodiment of the present invention. FIG. 15B includes a plan view and a front view showing a lead frame under fabrication process according to the seventh preferred embodiment. FIG. 15C includes a plan view and a front view showing a lead frame under fabrication process according to the seventh preferred embodiment. FIGS. 15D to 15I are cross-sectional views showing fabrication steps according to the seventh preferred embodiment.

A lead frame according to the seventh preferred embodiment includes a die pad 10 on which a semiconductor pellet 1 is placed thereon; a plurality of lead terminals 4, which are arranged to surround the die pad 10 and are wired to the semiconductor pellet 1; a lead terminal supporting bar 24, which is shaped square to surround the die pad 10 and support the plurality of lead terminals 4; and a die pad supporting bar 20, which is formed to extend radially from the die pad 10 and support the die pad 10. The lead terminal supporting bar 24 is shaped so that corners thereof, where the die pad supporting bar is crossing thereon, are bent inwardly. In other words, the four corners of the square shape of supporting bar 20 are cut off.

As shown in FIG. 15A, the supporting bars 24 are shaped to be square having sides, which are extending in parallel to sides of the die pad 10. On the supporting bars 24, wiring terminals 4 to be wire bonded to the semiconductor pellet 1 are extending inwardly toward the die pad 10. On the other hand, outer terminals 25 to be bonded onto substrate terminals (7) are extending outwardly. The wiring terminals 4 and the outer terminals 25 are arranged in line and are supported by the supporting bars 24. The wiring terminals 4 and the outer terminals 25 are arranged to extend from the opposite sides of the supporting bars 24. The supporting bars 24 are positioned out of a resin-molding area 26. A pair of the wiring terminal and the outer terminal form a lead terminal.

As shown in FIG. 15B, the outer terminals 25 are bent downwardly in a rectangular direction from the supporting bars 24. On the other hand, the wiring terminals 4 are not bent.

Next, as shown in FIG. 15C, the semiconductor pellet 1 is bonded onto the die pad 10 using an adhesive, then the semiconductor pellet 1 and the lead terminal (wiring terminal) 4 are wire-bonded using bonding wires 3.

Figure 15D:
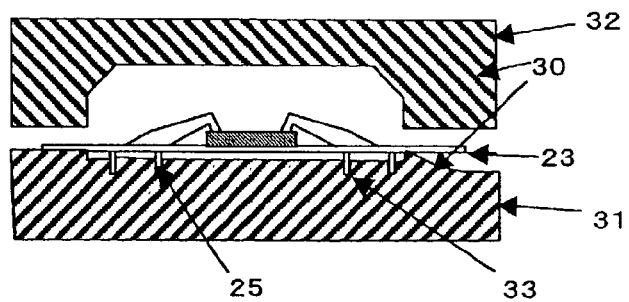
FIGS. 15D to 15I are cross-sectional views showing fabrication steps according to the seventh preferred embodiment.

Subsequently, as shown in FIG. 15D, the lead frame 23 is placed in a lower die 31 of a die set 30 for resin molding. At this time, the outer terminals 25, which have been bent, are inserted into terminal holes 33 formed on the lower die 31. After that, an upper die 32 is placed over the lower die 31.

Figure 15E:
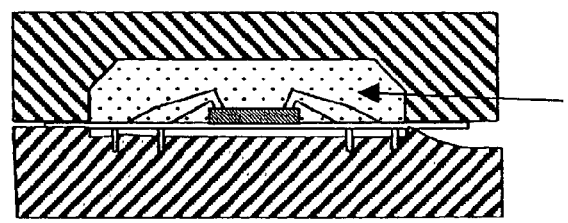

Now referring to FIG. 15E, a molding resin is filled into a cavity of the die set 30.

Figure 15F:
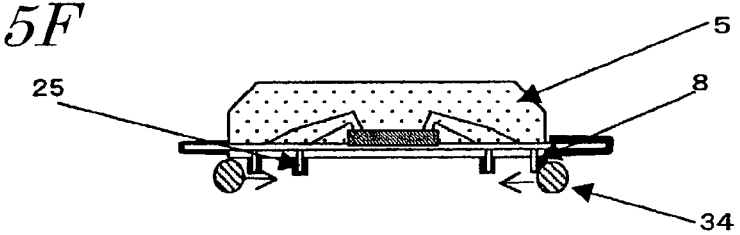

Next, as shown in FIG. 15F, the lead frame 23 is taken out of the die set 30, and the outer terminals 25, which are exposed to a resin-molding member 5, are coated with solder. After that, the outer terminals 25 are bent inwardly using a roller 34.

Figure 15G:
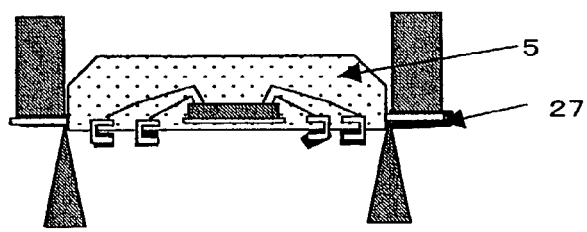

As shown in FIG. 15G, subsequently, an extraneous portion 27 of the lead frame 23 is removed.

Figure 15H:
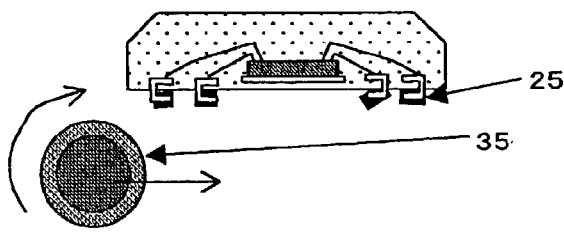
Figure 15I:

Next, as shown in FIG. 15H, the supporting bars 24 is cut by a high-speed rotary knife (peripheral cutting edge) 35 to complete a semiconductor apparatus, as shown in FIG. 15I.

The lead frame 23 is shaped so that the crossing points between the lead terminal supporting bars 24 and the die pad supporting bar 20 are arranged inside an area where to be resin-molded. In other words, the crossing points are arranged at position not to be bent. As a result, the crossing points are not cut in a bending process of the supporting bars 24.

Since the wiring terminals of the lead terminals 4 are covered and protected by the resin-molding member 5, undesired stress generated in a cutting process of the lead terminals can be prevented from being transferred to the wiring terminals (4). As described above, according to the seventh preferred embodiment, the wiring terminals 4 are covered with a resin, the wiring terminals 4 are prevented from being broken.

Eighth Preferred Embodiment

Figure 16A:
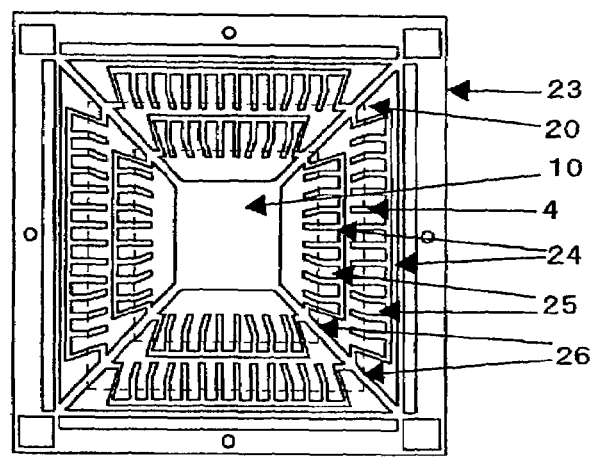
FIG. 16A is a plan view illustrating a lead frame used for fabricating a semiconductor apparatus according to an eighth preferred embodiment of the present invention.
Figure 16B:
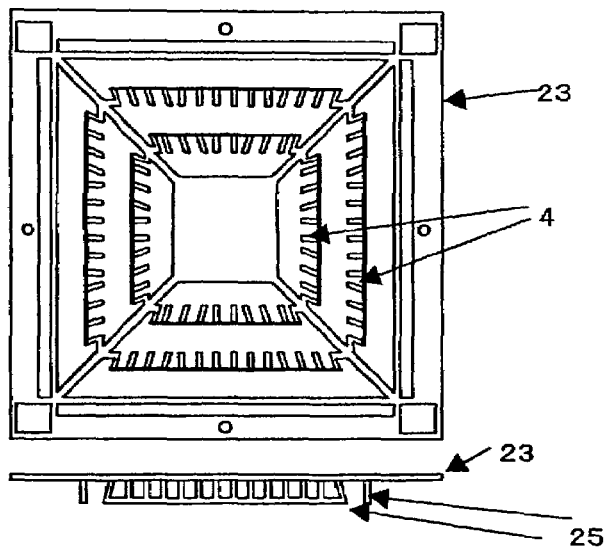
FIG. 16B includes a plan view and a front view showing a lead frame under fabrication process according to the eighth preferred embodiment.
Figure 16C:
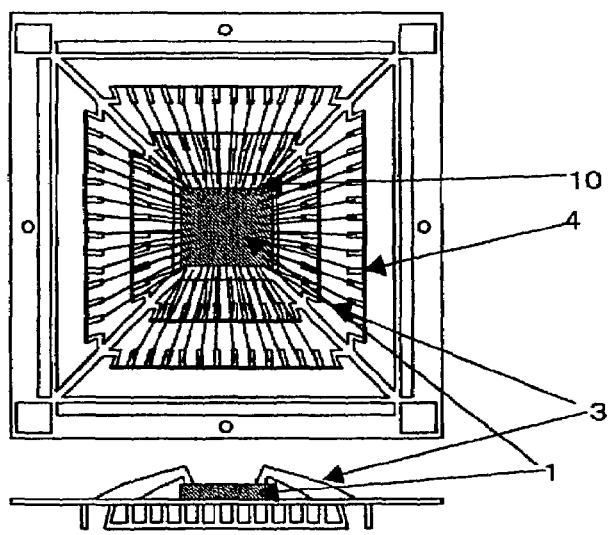
FIG. 16C includes a plan view and a front view showing a lead frame under fabrication process according to the eighth preferred embodiment.

FIG. 16A is a plan view illustrating a lead frame used for fabricating a semiconductor apparatus according to an eighth preferred embodiment of the present invention. FIG. 16B includes a plan view and a front view showing a lead frame under fabrication process according to the eighth preferred embodiment. FIG. 16C includes a plan view and a front view showing a lead frame under fabrication process according to the eighth preferred embodiment. FIGS. 16D to 16I are cross-sectional views showing fabrication steps according to the eighth preferred embodiment.

A lead frame according to the eight preferred embodiment includes a die pad 10 on which a semiconductor pellet 1 is placed thereon; a plurality of lead terminals 4, which are arranged to surround the die pad 10 and are wired to the semiconductor pellet 1; a lead terminal supporting bar 24, which is shaped square to surround the die pad 10 and support the plurality of lead terminals 4; and a die pad supporting bar 20, which is formed to extend radially from the die pad 10 and support the die pad 10. The lead terminal supporting bar 24 is shaped so that corners thereof, where the die pad supporting bar 20 is crossing thereon, are bent inwardly. In other words, the four corners of the square shape of supporting bar 20 are cut off.

As shown in FIG. 16A, the supporting bars 24 are shaped to be square having sides, which are extending in parallel to sides of the die pad 10. On the supporting bars 24, both of wiring terminals 4 to be wire bonded to the semiconductor pellet 1 and outer terminals 25 are extending inwardly toward the die pad 10. In other words, the wiring terminals 4 and the outer terminals 25 form inner and outer portions of the lead terminals, respectively. A pair of the wiring terminal and the outer terminal form a single lead terminal. The wiring terminals 4 and the outer terminals 25 are arranged in line and are supported by the supporting bars 24. The supporting bars 24 are positioned out of a resin-molding area 26.

As shown in FIG. 16B, the outer terminals 25 and the supporting bars 24 are bent downwardly in a rectangular direction. On the other hand, the wiring terminals 4 are not bent but maintained in a horizontal position.

Next, as shown in FIG. 16C, the semiconductor pellet 1 is bonded onto the die pad 10 using an adhesive, then the semiconductor pellet 1 and the lead terminal (wiring terminal) 4 are wire-bonded using bonding wires 3.

Figure 16D:
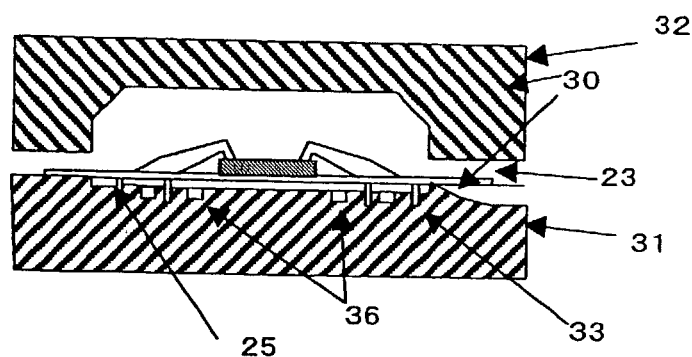
FIGS. 16D to 16I are cross-sectional views showing fabrication steps according to the eighth preferred embodiment.

Subsequently, as shown in FIG. 16D, the lead frame 23 is placed in a lower die 31 of a die set 30 for resin molding. At this time, the outer terminals 25, which have been bent, are inserted into terminal holes 33 formed on the lower die 31. The lower die 31 is provided with dents 36, in which a resin is to be filled. After that, an upper die 32 is placed over the lower die 31.

Figure 16E:
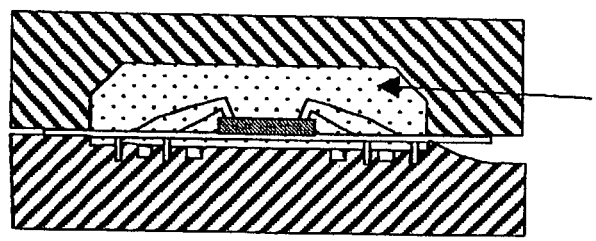

Now referring to FIG. 16E, a molding resin is filled into a cavity of the die set 30.

Figure 16F:
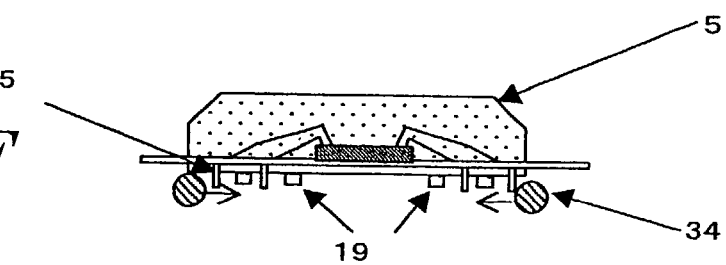

Next, as shown in FIG. 16F, the lead frame 23 is taken out of the die set 30, and the outer terminals 25 are bent inwardly using a roller 34 until the outer terminals 25 are in contact with projected portions 19. The projected portions 19 are formed when a resin is filled into the dents 36.

Figure 16G:
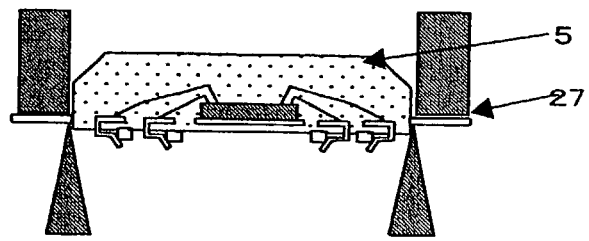

As shown in FIG. 16G, subsequently, an extraneous portion 27 of the lead frame 23 is removed.

Figure 16H:
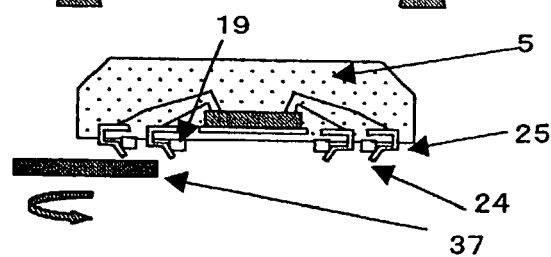
Figure 16I:
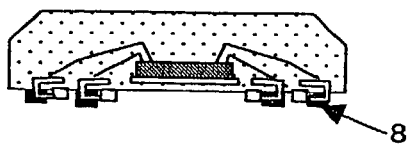

Next, as shown in FIG. 16H, the supporting bars 24 extended out of the projected portions 19 are removed using a high-speed rotary grinder 37. After that, the outer terminals 25, which are exposed to a resin-molding member 5, are coated with solder to complete a semiconductor apparatus, as shown in FIG. 16I.

The lead frame 23 is shaped so that the crossing points between the lead terminal supporting bars 24 and the die pad supporting bar 20 are arranged inside an area 26 where to be resin-molded. In other words, the crossing points are arranged at position not to be bent. As a result, the crossing points are not cut in a bending process of the supporting bars 24.

Since the wiring terminals of the lead terminals 4 are covered and protected by the resin-molding member 5, undesired stress generated in a cutting process of the lead terminals can be prevented from being transferred to the wiring terminals (4). As described above, according to the seventh preferred embodiment, the wiring terminals 4 are covered with a resin, the wiring terminals 4 are prevented from being broken.

Further, according to this embodiment, the lead terminal supporting bars 24 are extended downwardly using the projected portions 19 of resin, and the supporting bars 24 are removed in a grinding process. As a result, a separating process of lead terminals can be carried out for a large number of semiconductor apparatus at the same time. Therefore, fabricating time and costs of semiconductor apparatus can be reduced.

Other Modifications or Variations (1) In the first to sixth preferred embodiments, although the lead terminals 4 are bent inwardly, the lead terminals 4 can be bent outwardly instead.

(2) In the fourth preferred embodiment, although the openings 12 formed at the contact portions 9 of the lead terminals 4 are round shapes, other shapes of openings and grooves can be employed.

(3) In the first to sixth preferred embodiments, although the lead terminals 4 are coated with solder, the lead terminals 4 can be provided with balls at the contact portions 9 instead of the solder coating.

(4) In the sixth preferred embodiment, although the semiconductor apparatus has four alignment holes 22 at the four corners, the number of such alignment holes are not limited by four, but can be one, two or three.

(5) In the sixth preferred embodiment, although the alignment holes 22 are round shapes, other shapes of openings can be employed.

(6) In the seventh preferred embodiment, although the lead terminals 4 are cut by a peripheral cutting edge, the lead terminals 4 can be removed in laser cutting process or high pressure jet process instead.

(7) In the first to eighth preferred embodiments, although the lead terminals 4 are arranged in two lines, the number of lines of the lead terminals 4 are not limited by two, but can be more than two instead.

OTHER FEATURES OR ADVANTAGES OF THE PRESENT INVENTION

A semiconductor apparatus according to the present invention, does not have any lead terminals extending horizontal from sides thereof, so that a mounting space can be reduced. As a result, staggered type of lead terminals can be used to increase the number of terminals or pins.

What is claimed is:

1. A semiconductor apparatus, comprising:
   a semiconductor pellet having electrodes thereon;
   a plurality of lead terminals, which electrically connect the electrodes of the semiconductor pellet to terminals formed on a substrate; and
   a molding member having a top surface and a bottom surface, which is filled around the semiconductor pellet and upper parts of the lead terminals,
   wherein the plurality of lead terminals are shaped to be elongated strips and are arranged to extend out of the bottom surface of the molding member toward the substrate, and wherein the bottom surface of the molding member opposes the substrate.

2. A semiconductor apparatus, according to claim 1, wherein lower parts of the lead terminals, which are exposed to the molding member, are coated by solder.

3. A semiconductor apparatus, according to claim 1, wherein the lead terminals are made of a material selected from iron and copper.

4. A semiconductor apparatus, according to claim 1, wherein lower parts of the lead terminals, which are exposed from the molding member, are shaped to extend straight down to the substrate and are bent at ends to be parallel to surfaces of the terminals on the substrate.

5. A semiconductor apparatus, according to claim 1, wherein the lead terminals are shaped to have a thickness or width less than 300 μm.

6. A semiconductor apparatus, according to claim 1, wherein lower parts of the lead terminals, which are exposed from the molding member, are shaped to have a length longer than 200 μm.

7. A semiconductor apparatus, according to claim 1, wherein the lead terminals are shaped to be wider at lower ends thereof which are in contact with the substrate terminals.

8. A semiconductor apparatus, according to claim 7, wherein the wider ends of the lead terminals are shaped to have round planar area.

9. A semiconductor apparatus, according to claim 1, wherein the molding member comprises projections which project toward the substrate, wherein lower ends of the lead terminals are bent or curved along the projections.

10. A semiconductor apparatus, according to claim 1, wherein a lower end of each of the lead terminals is provided with an opening into which a test terminal is insertable for an electrical test.

11. A semiconductor apparatus, according to claim 1, further comprising:
    a die pad on which the semiconductor pellet is arranged,
    wherein at least one of the plurality of lead terminals is electrically connected between the die pad and a terminal of the substrate.

12. A semiconductor apparatus, according to claim 1, further comprising:
    a die pad on which the semiconductor pellet is arranged; and
    a plurality of support bars which are arranged to extend outwardly from the die pad to support the die pad in the semiconductor apparatus,
    wherein outer ends of the support bars are provided with alignment members which are used when the semiconductor apparatus is mounted on a board.

13. A semiconductor apparatus, according to claim 12, wherein the alignment members are holes formed at the outer ends of the support bars.

14. A lead frame, comprising:
    a die pad on which a semiconductor pellet is placed on;
    a plurality of lead terminals, which are arranged to surround the die pad and are wired to the semiconductor pellet;
    a lead terminal supporting bar, which is shaped square to surround the die pad and support the plurality of lead terminals; and
    a die pad supporting bar, which is formed to extend radially from the die pad and support the die pad,
    wherein the lead terminal supporting bar is shaped in order that corners thereof, where the die pad supporting bar is crossing thereon, are bent inwardly.

15. A lead frame, according to claim 14, wherein the lead terminals are made of a material selected from iron and copper.

16. A lead frame, according to claim 14, wherein the lead terminals are shaped to have a thickness or width less than 300 μm.

* * * * *